United States Patent
Kim

(10) Patent No.: US 12,431,405 B2
(45) Date of Patent: Sep. 30, 2025

(54) SEMICONDUCTOR DEVICE AND METHOD OF FORMING THIN HEAT SINK USING E-BAR SUBSTRATE

(71) Applicant: STATS ChipPAC Pte. Ltd., Singapore (SG)

(72) Inventor: Jongtae Kim, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 624 days.

(21) Appl. No.: 17/812,224

(22) Filed: Jul. 13, 2022

(65) Prior Publication Data

US 2024/0021490 A1 Jan. 18, 2024

(51) Int. Cl.
*H01L 23/367* (2006.01)
*H01L 21/48* (2006.01)
(Continued)

(52) U.S. Cl.
CPC ...... *H01L 23/3675* (2013.01); *H01L 21/4882* (2013.01); *H01L 23/49816* (2013.01); *H01L 23/552* (2013.01); *H01L 25/162* (2013.01); *H01L 25/165* (2013.01); *H01L 23/49833* (2013.01); *H01L 23/5385* (2013.01);
(Continued)

(58) Field of Classification Search
CPC ............ H01L 23/3675; H01L 21/4882; H01L 23/49816; H01L 23/552; H01L 25/162; H01L 25/165; H01L 23/49833; H01L 23/5385; H01L 24/16; H01L 24/32; H01L 24/73; H01L 2224/16225; H01L 2224/32225; H01L 2224/32245; H01L 2224/73204; H01L 2224/73253; H01L 2924/1611; H01L 2924/1616; H01L 2924/16235; H01L 2924/16251; H01L 2924/1631; H01L 2924/16315; H01L 2924/1632; H01L 23/5389; H01L 23/3736; H01L 23/49822; H01L 23/49827; H01L 23/367; H01L 21/4871; H01L 21/50;
(Continued)

(56) References Cited

U.S. PATENT DOCUMENTS 6,849,942 B2 2/2005 Lin et al.
9,190,399 B2 11/2015 Lamorey et al.
(Continued)

*Primary Examiner* — Jonathan Han
(74) *Attorney, Agent, or Firm* — Robert D. Atkins; PATENT LAW GROUP: Atkins and Associates, P.C.

(57) ABSTRACT

A semiconductor device has a substrate and a semiconductor package disposed over the substrate. An embedded bar (e-bar) substrate is disposed on the substrate around the semiconductor package. A heat sink is formed over the semiconductor package and supported by the e-bar substrate to elevate the heat sink from the substrate and reduce a thickness of the heat sink. A thermal interface material is deposited between the semiconductor package and heat sink. Alternatively, a shield layer can be formed over the semiconductor package and supported by the e-bar substrate. The e-bar substrate has a base layer and a first metal layer formed over a first surface of the base layer. A bump is formed over the first metal layer. A second metal layer can be over a second surface of the base layer opposite the first surface of the base layer. Two or more e-bar substrates can be stacked.

29 Claims, 18 Drawing Sheets

(51) Int. Cl.
*H01L 23/00* (2006.01)
*H01L 23/498* (2006.01)
*H01L 23/538* (2006.01)
*H01L 23/552* (2006.01)
*H01L 25/16* (2023.01)

(52) U.S. Cl.
CPC .............. *H01L 24/16* (2013.01); *H01L 24/32* (2013.01); *H01L 24/73* (2013.01); *H01L 2224/16225* (2013.01); *H01L 2224/32225* (2013.01); *H01L 2224/32245* (2013.01); *H01L 2224/73204* (2013.01); *H01L 2224/73253* (2013.01); *H01L 2924/1611* (2013.01); *H01L 2924/1616* (2013.01); *H01L 2924/16235* (2013.01); *H01L 2924/16251* (2013.01); *H01L 2924/1631* (2013.01); *H01L 2924/16315* (2013.01); *H01L 2924/1632* (2013.01)

(58) Field of Classification Search
CPC .......... H01L 21/4846; H01L 23/49838; H05K 3/3436; H05K 1/181; H05K 2201/10734
See application file for complete search history.

(56) References Cited

U.S. PATENT DOCUMENTS

| | | |
|---|---|---|
| 10,515,887 B2 | 12/2019 | Syu et al. |
| 2010/0213600 A1* | 8/2010 | Lau ..................... H01L 23/5384 |
| | | 438/122 |
| 2012/0187578 A1* | 7/2012 | Li ..................... H01L 23/49827 |
| | | 257/778 |
| 2015/0255441 A1* | 9/2015 | Lamorey ................. H01L 25/50 |
| | | 438/107 |

* cited by examiner

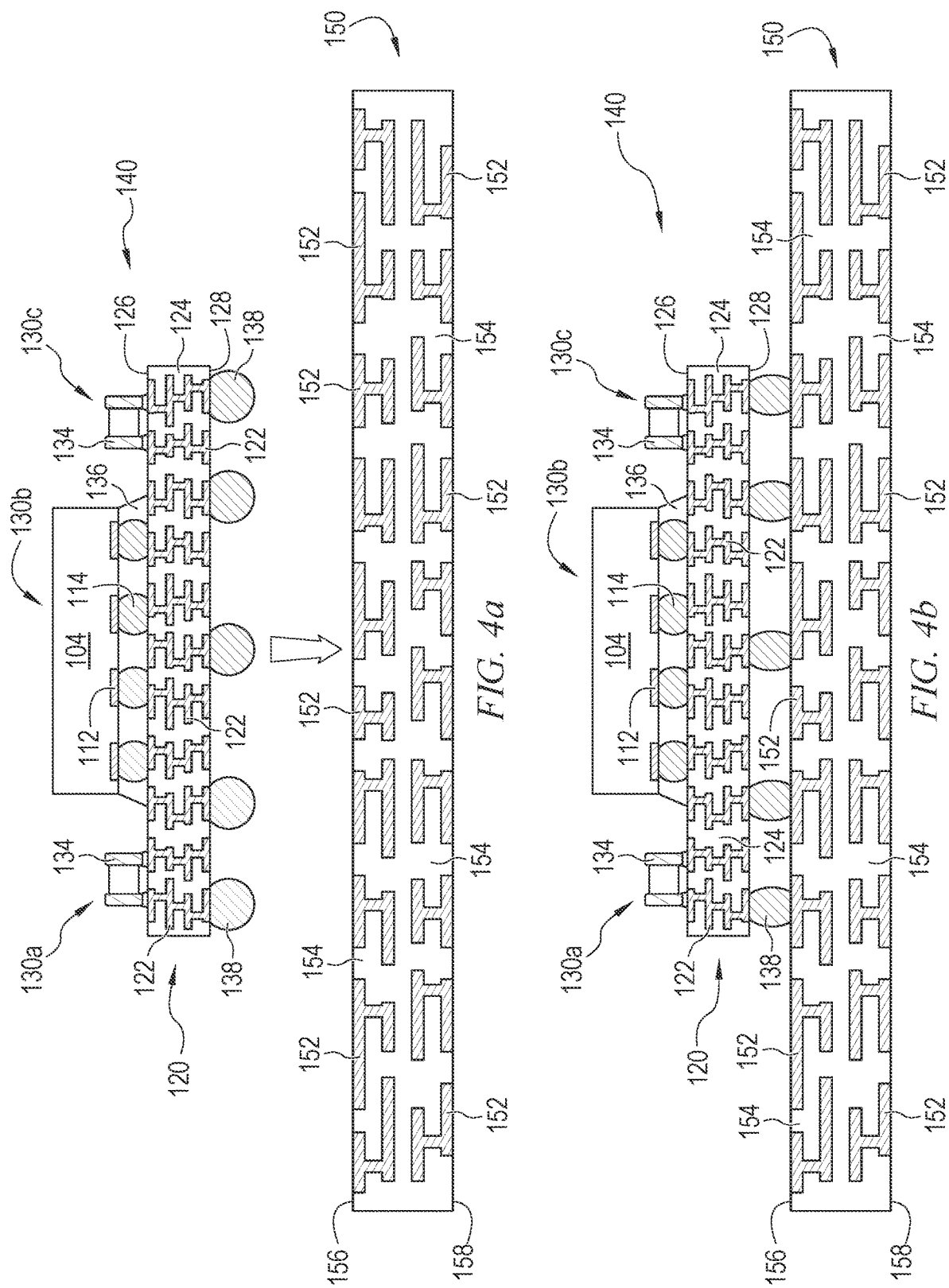

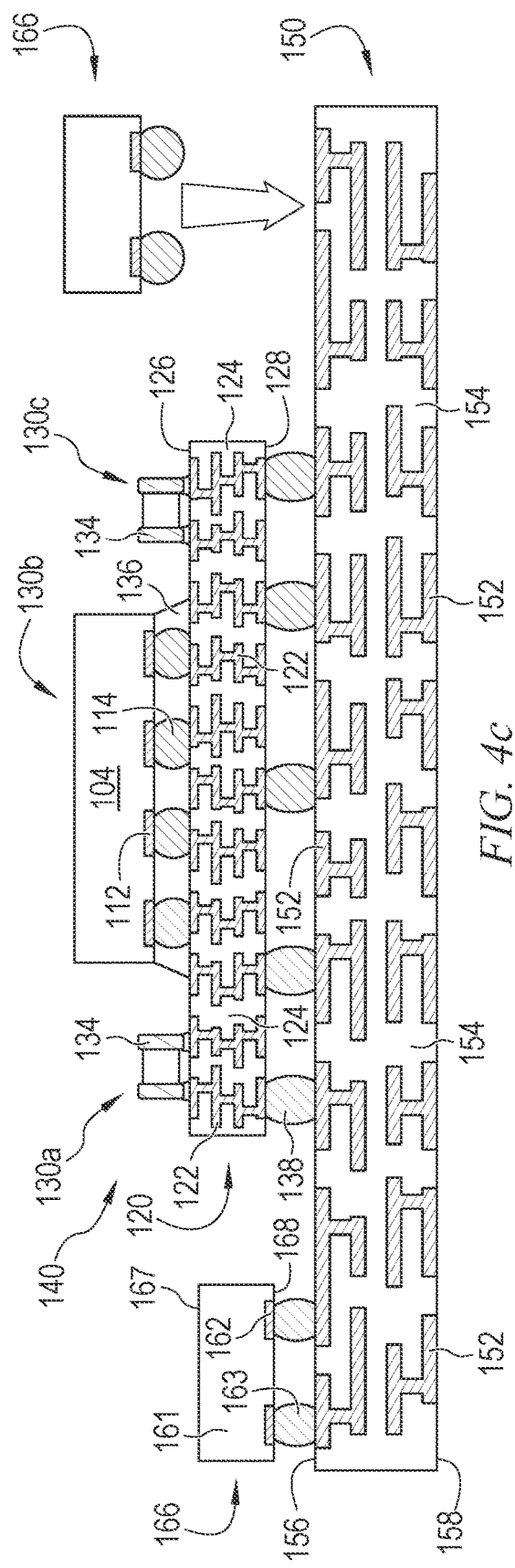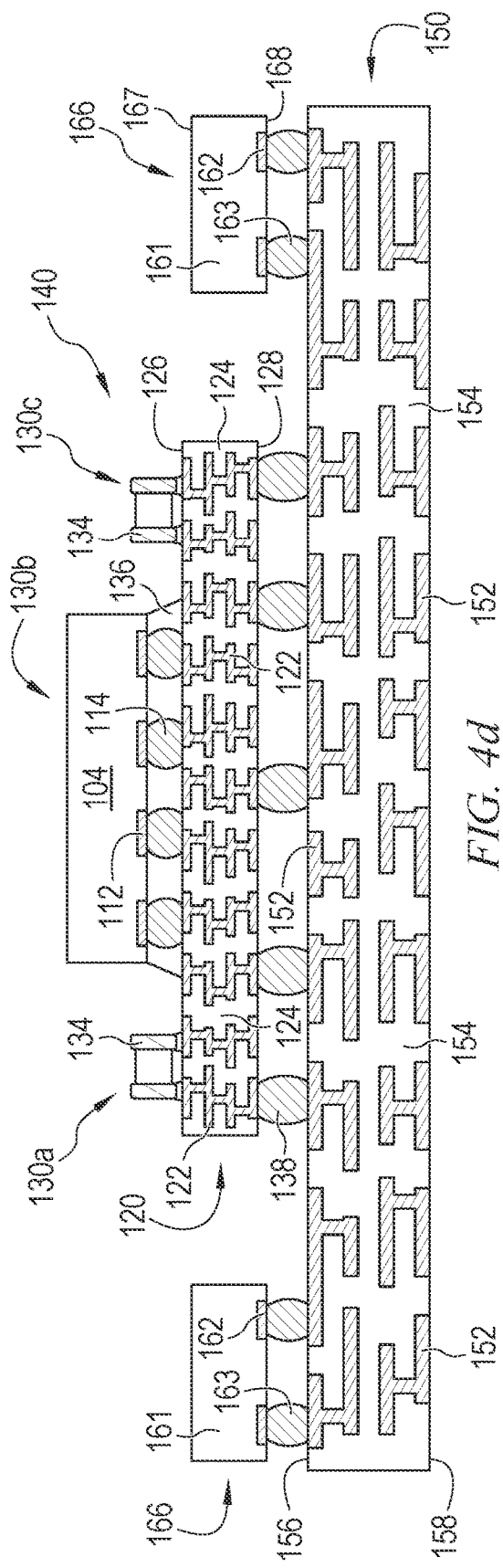

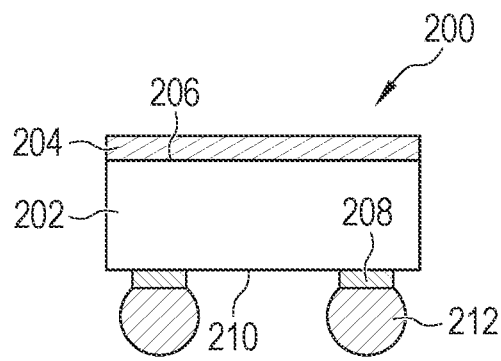
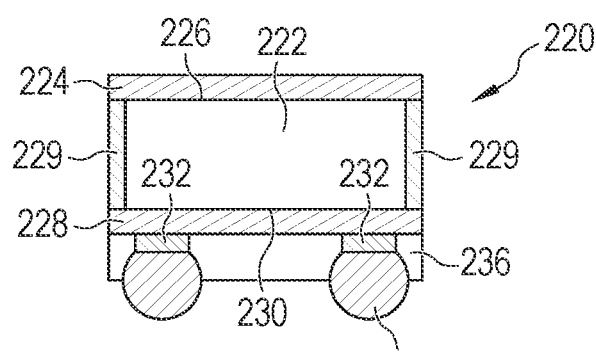
FIG. 5a    FIG. 5b
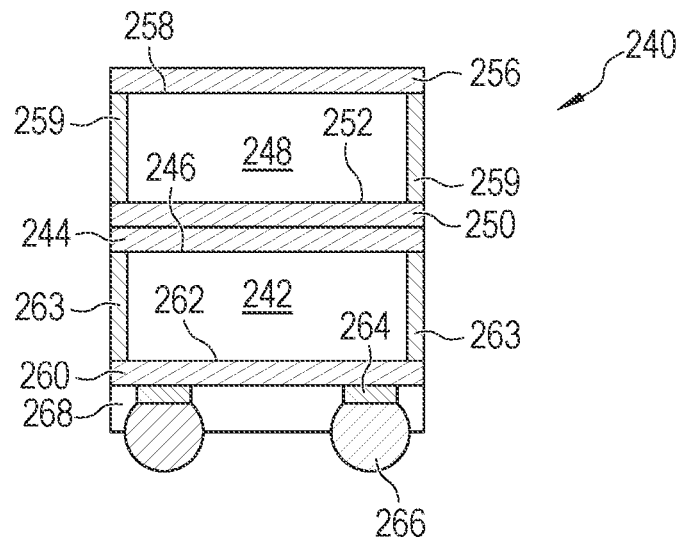
FIG. 5c
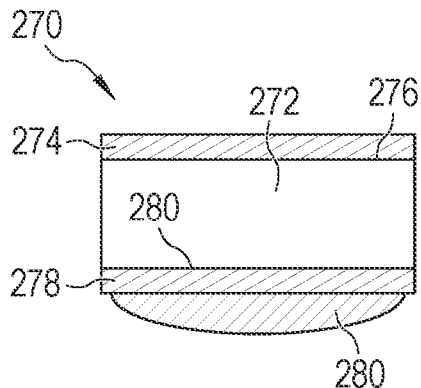
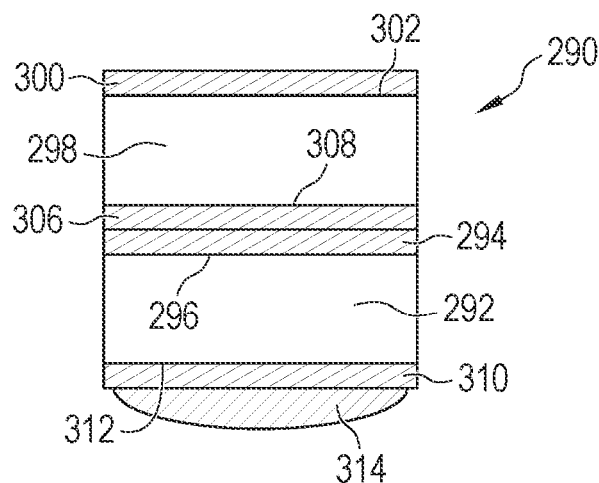
FIG. 5d    FIG. 5e

SEMICONDUCTOR DEVICE AND METHOD OF FORMING THIN HEAT SINK USING E-BAR SUBSTRATE

FIELD OF THE INVENTION

The present invention relates in general to semiconductor devices and, more particularly, to a semiconductor device and method of forming a thin heat sink using an e-bar substrate.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

One or more semiconductor die can be integrated into a semiconductor package for higher density in a small space and extended electrical functionality. The trend is toward higher performance, higher integration, and miniaturization. As an example, many semiconductor products are being developed using high density interconnection (HDI) substrate and interposer substrate. The high level of integration contributes to heat generation during operation. A heat sink or heat spreader is commonly used to dissipate excess heat.

In the case of a ball grid array (BGA) package, the heat sink must cover the semiconductor package and then extend down to the HDI substrate for structural support. The extension of the heat sink down to the HDI substrate can become problematic for tall semiconductor packages. Most manufacturing guidelines limit the heat sink height, including vertical extensions, to 3 times of the thickness of the horizontal portion of the heat sink over the semiconductor package. If length of the vertical extension is greater than 3 times the thickness of the horizontal portion over the semiconductor package, then the heat sink is subject to breakage, warpage, and premature failure.

BRIEF DESCRIPTION OF THE DRAWINGS

FIGS. 4a-4k illustrate a process of forming a BGA semiconductor package with a heat sink elevated by e-bar substrates;

FIG. 5a-5g illustrate other forms of the e-bar substrates;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
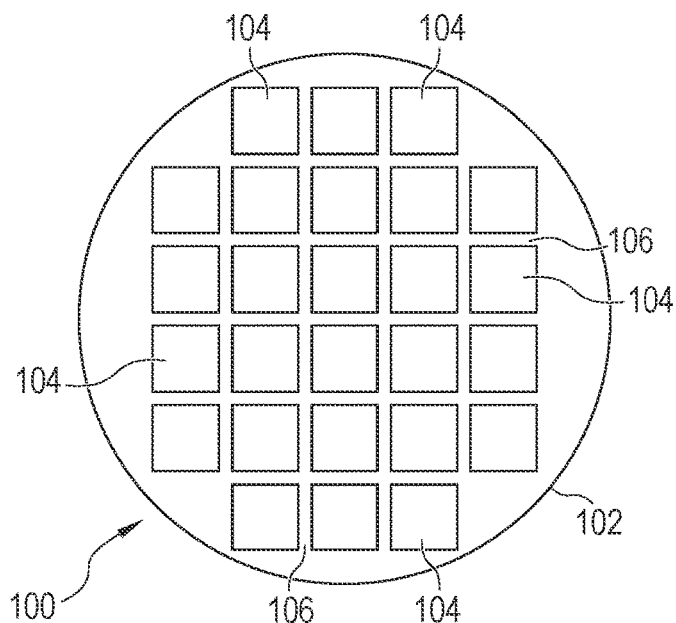
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
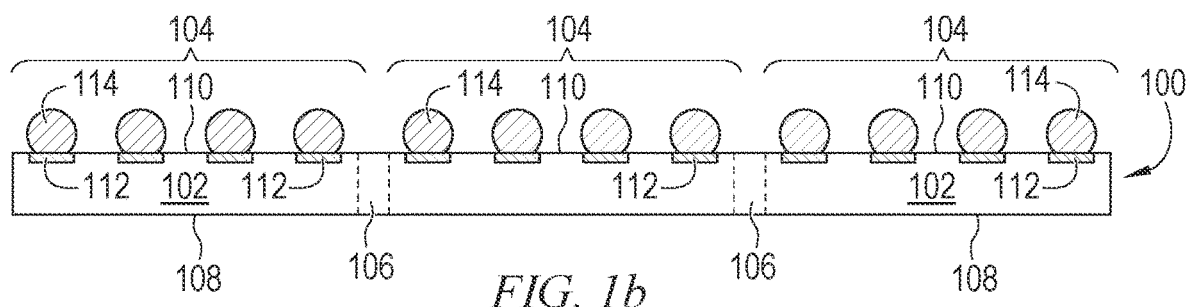

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
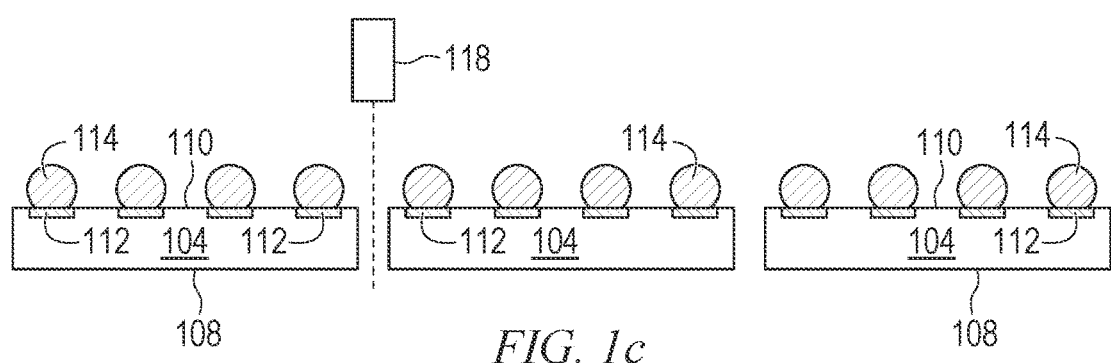

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2A:
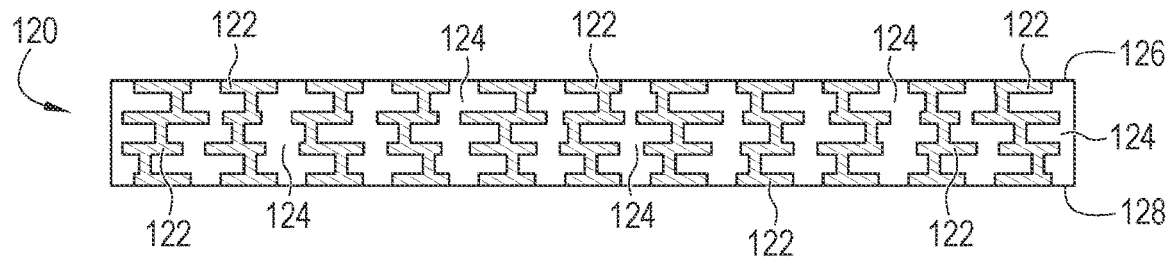
FIGS. 2a-2c illustrate a process of forming a semiconductor package with electronic components and interconnect substrate.
Figure 2B:
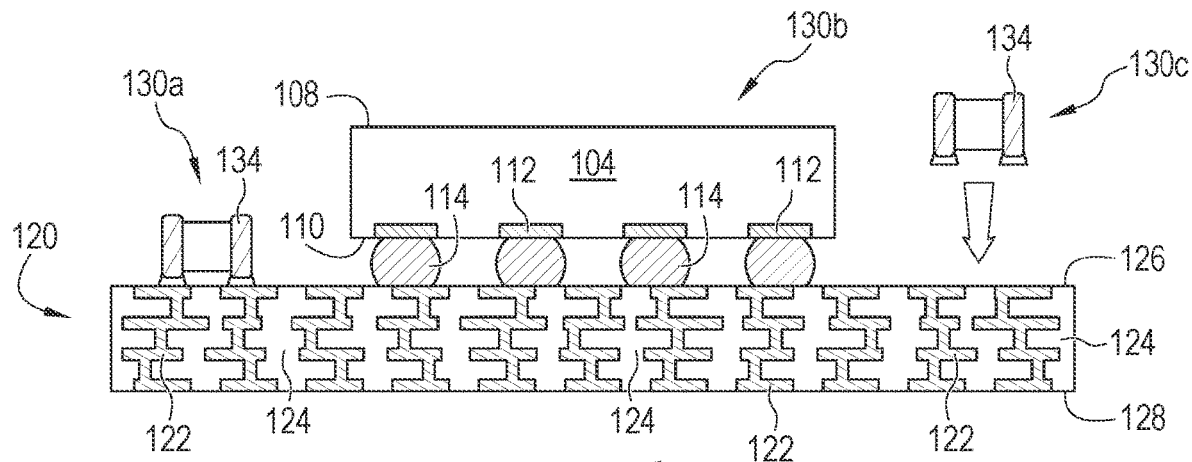
Figure 2C:
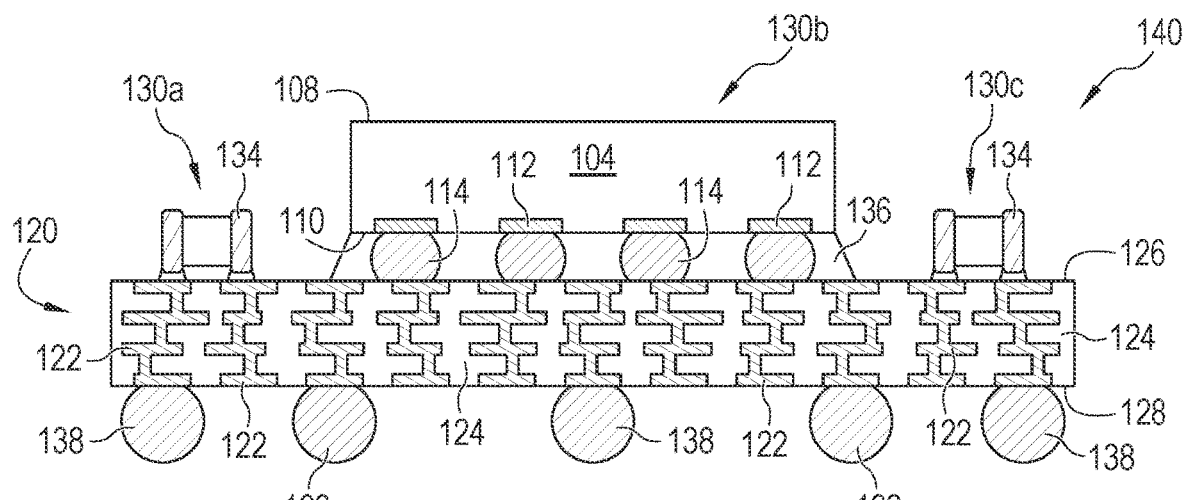

FIGS. 2a-2c illustrate a process of forming a semiconductor package with electronic components disposed over an interconnect substrate. FIG. 2a shows a cross-sectional view of interconnect substrate 120 including conductive layers 122 and insulating layer 124. Conductive layer 122 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide, benzocyclobutene (BCB), polybenzoxazoles (PBO), and other material having similar insulating and structural properties. Insulating layers can be formed using PVD, CVD, printing, lamination, spin coating, spray coating, sintering or thermal oxidation. Insulating layer 124 provides isolation between conductive layers 122. Interconnect substrate 120 can be an HDI substrate having multiple layers, high density circuits, and fine line spacing to increase functionality while using less area.

In FIG. 2b, a plurality of electrical components 130a-130c is disposed on surface 126 of interconnect substrate 120 and electrically and mechanically connected to conductive layers 122. Electrical components 130a-130c are each positioned over substrate 120 using a pick and place operation. For example, electrical component 130b can be similar to semiconductor die 104 from FIG. 1c with active surface 110 and bumps 114 oriented toward surface 126 of substrate 120. Electrical components 130a and 130c can be discrete electrical devices, or IPDs, such as a diode, transistor, resistor, capacitor, and inductor, with terminals 134 disposed on surface 126 of interconnect substrate 120 and electrically and mechanically connected to conductive layers 122. Alternatively, electrical components 130a-130c can include other semiconductor die, semiconductor packages, surface mount devices, discrete electrical devices, or IPDs.

Electrical components 130a-130c are brought into contact with surface 126 of interconnect substrate 120. FIG. 2c illustrates electrical components 130a-130c electrically and mechanically connected to conductive layers 122 of substrate 120. An underfill material 136, such as epoxy resin, is deposited under electrical component 130b.

An electrically conductive bump material is deposited over conductive layer 122 on surface 128 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 138. In one embodiment, bump 138 is formed over a UBM having a wetting layer, barrier layer, and adhesive layer. Bump 138 can also be compression bonded or thermocompression bonded to conductive layer 122. In one embodiment, bump 138 is a copper core bump for durability and maintaining its height. Bump 138 represents one type of interconnect structure that can be formed over conductive layer 122. The interconnect structure can also use bond wires, conductive paste, stud bump, micro bump, or other electrical interconnect.

The combination of interconnect substrate 120 and electrical components 130a-130c constitute semiconductor package 140.

Figure 3A:
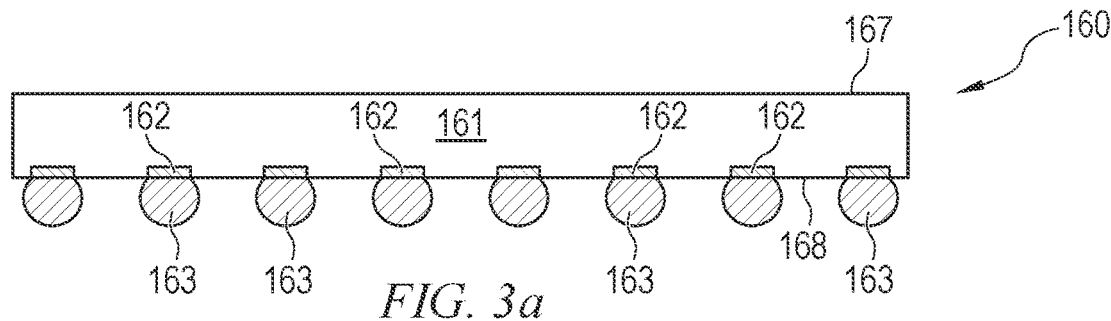
FIGS. 3a-3d illustrate a process of forming e-bar substrates.

FIG. 3a illustrates embedded bar (e-bar) wafer 160 containing base layer 161 and contacts 162. Base layer 161 can be made of one or more layers of $SiO_2$, $Si_3N_4$, SiON, $Ta_2O_5$, $Al_2O_3$, solder resist, polyimide, BCB, PBO, and other material having similar insulating and structural properties. Base layer 161 can also be a multi-layer flexible laminate, ceramic, copper clad laminate (CCL), glass, or epoxy molding compound. In another embodiment, base layer 161 can also be any suitable laminate interposer, PCB, wafer-form, strip interposer, leadframe, or other type of substrate. Base layer 161 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. In one embodiment, base layer 161 is a CCL. Wafer 160 includes first major surface 167 and second major surface 168 opposite surface 167.

Figure 3B:
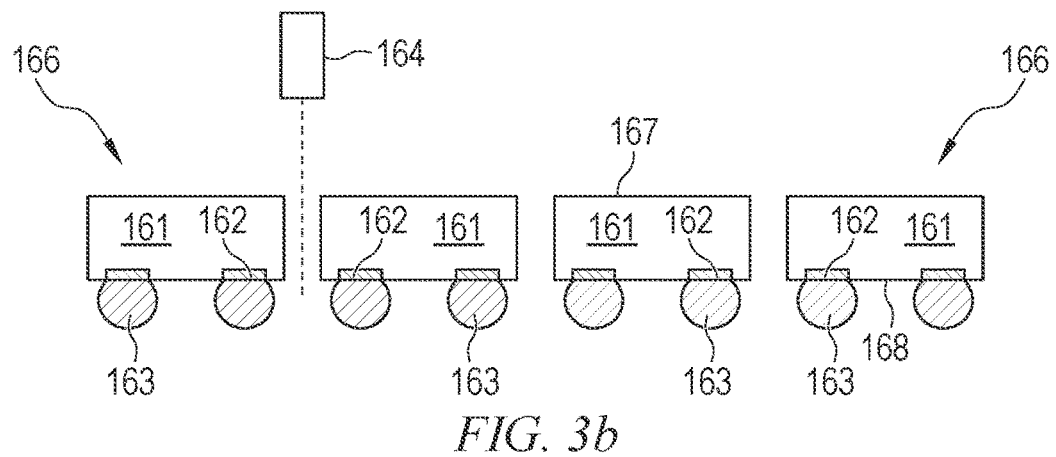
Figure 3C:
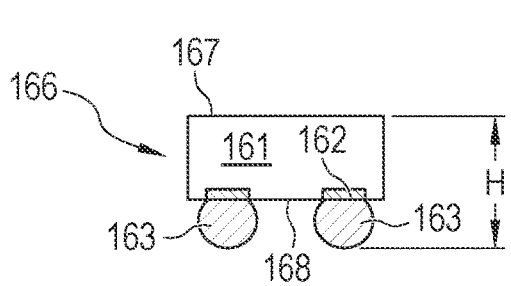
Figure 3D:
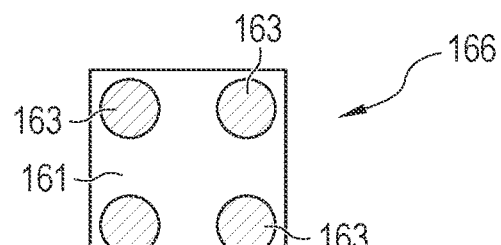

Contacts 162 can be one or more layers of Al, Cu, Sn, Ni, Au, Ag, or other suitable material on which to form bumps. Bumps 163 are formed on contacts 162. In FIG. 3b, e-bar wafer 160 is singulated with saw blade or laser cutting tool 164 into individual e-bar substrates or structures 166. FIG. 3c shows e-bar substrate 166 post singulation. FIG. 3d is a bottom view of e-bar substrate. E-bar substrate 166 has a height similar to substrate 120. In one embodiment, e-bar substrate 166 has a height H of 550-750 µm, including bumps 163 and depending on the height of substrate 120. With, for example, CCL base layer 161, e-bar substrate 166 is rigid and generally non-compressible, within the context of the application, to support an overlaying structure, such as a heat sink or shielding layer as described below.

FIG. 4a shows a cross-sectional view of interconnect substrate 150 including conductive layers 152 and insulating layer 154. Conductive layer 152 can be one or more layers of Al, Cu, Sn, Ni, Au, Ag, or other suitable electrically conductive material. Conductive layers can be formed using PVD, CVD, electrolytic plating, electroless plating process, or other suitable metal deposition process. Conductive layer 152 provides horizontal electrical interconnect across substrate 150 and vertical electrical interconnect between top surface 156 and bottom surface 158 of substrate 150. Portions of conductive layer 152 can be electrically common or electrically isolated depending on the design and function of semiconductor die 104 and other electrical components. Insulating layer 154 contains one or more layers of $SiO_2$, $Si_3N_4$, SiON, $Ta_2O_5$, $Al_2O_3$, solder resist, polyimide, BCB, PBO, and other material having similar insulating and structural properties. Insulating layers can be formed using PVD, CVD, printing, lamination, spin coating, spray coating, sintering or thermal oxidation. Insulating layer 154 provides isolation between conductive layers 152. Interconnect substrate 150 is an HDI substrate having multiple layers, high density circuits, and fine line spacing to increase functionality while using less area.

Semiconductor package 140 from FIG. 2c is positioned over surface 156 of interconnect substrate 150 with bumps 138 oriented toward the substrate. Semiconductor package 140 is brought into contact with surface 156 of interconnect substrate 150. FIG. 4b shows semiconductor package 140 disposed on interconnect substrate 150 with bumps 138 electrically and mechanically connected to conductive layer 152 on surface 156.

Figure 4E:
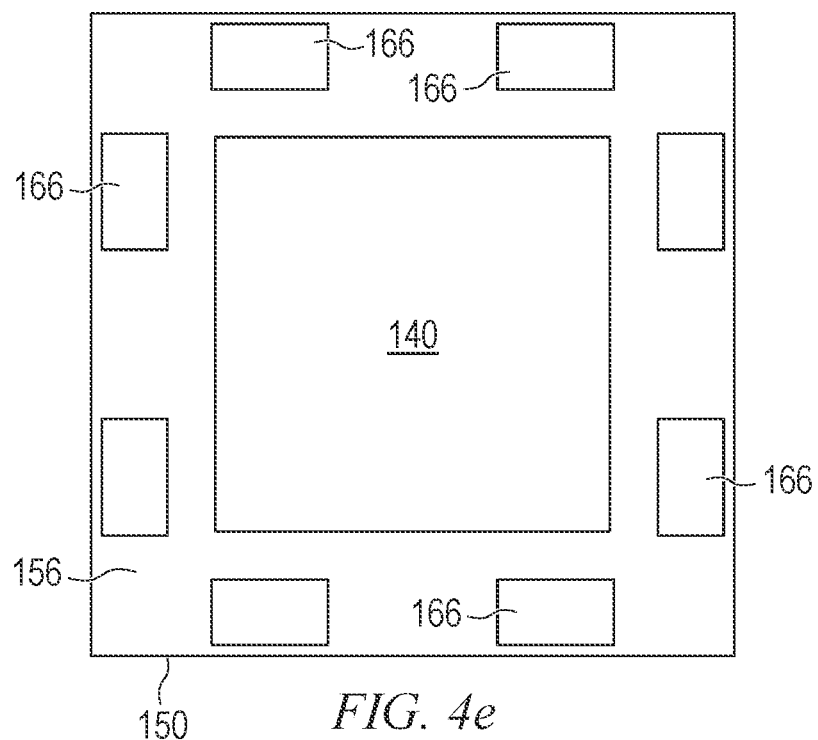
Figure 4F:
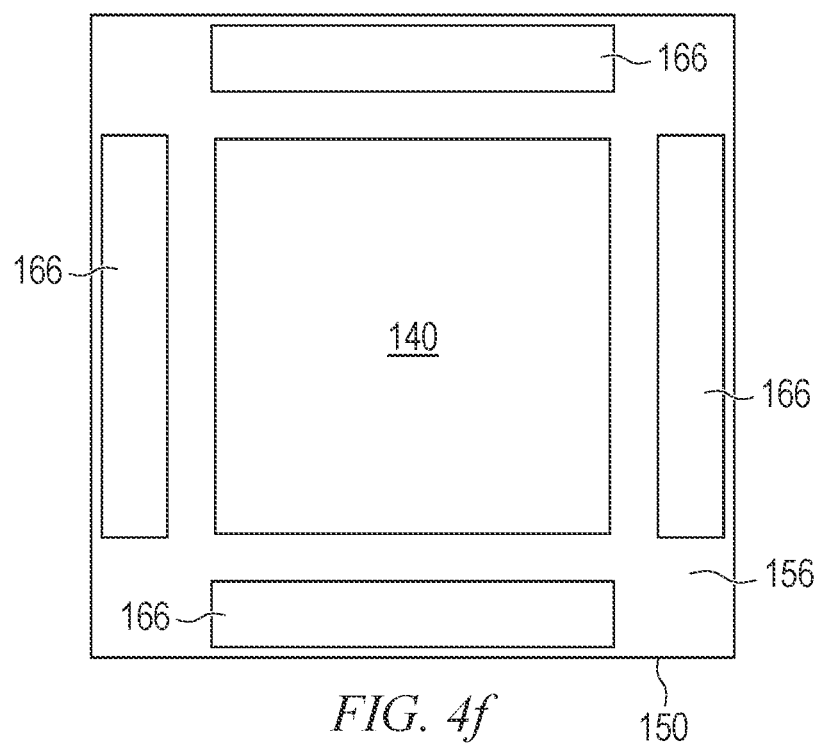

In FIG. 4c, a plurality of e-bar substrates 166 from FIGS. 3a-3d is positioned over surface 156 of interconnect substrate 150 with bumps 163 oriented toward the substrate. E-bar substrates 166 are brought into contact with interconnect substrate 150. FIG. 4d shows e-bar substrates 166 disposed on interconnect substrate 150 with bumps 163 electrically and mechanically connected to conductive layer 152 on surface 156. FIG. 4e shows a top view of e-bar substrates 166 disposed on interconnect substrate 150. E-bar substrates 166 are rigid and non-compressible to provide physical and structural support for later-formed heat sink. FIG. 4f is a top view of an alternate shape for e-bar substrates 166, in this case the e-bar substrates extending a length of semiconductor package 140.

Figure 4G:
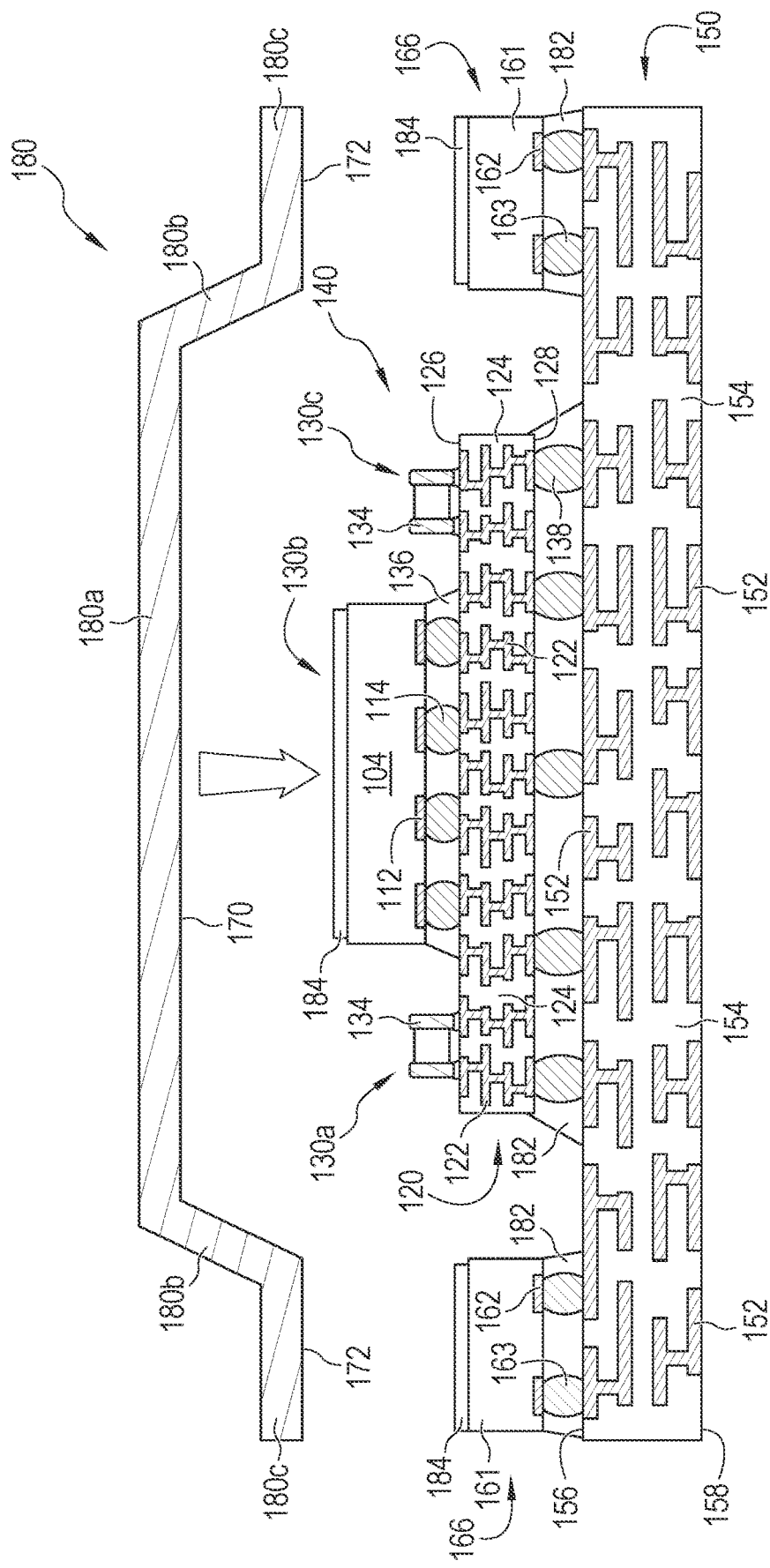

In FIG. 4g, heat sink or heat spreader 180 is positioned over e-bar substrates 166 and semiconductor package 140. Heat sink 180 can be one or more layers of Al, Cu, Sn, Ni, Au, Ag, or other suitable thermally conductive material. Heat sink 180 includes horizontal portion 180a, angled or vertical portion 180b, and horizontal portion 180c. An underfill material 182, such as epoxy resin, is deposited under semiconductor package 140 around bumps 138 and under e-bar substrates 166 around bumps 163.

An adhesive layer 184 is provided on back surface 108 of electrical component 130b and surface 185 of e-bar substrates 166. In one embodiment, layer 184 can be a thermal interface material (TIM), such as an adhesive with filler containing alumina, Al, aluminum zinc oxide, or other material having good heat transfer properties. In another embodiment, layer 184 can be solder, such as in the case of an e-bar substrate like FIG. 5b. Alternatively, adhesive layer 184 can be deposited on surfaces 170 and 172 of heat sink 180.

Figure 4H:
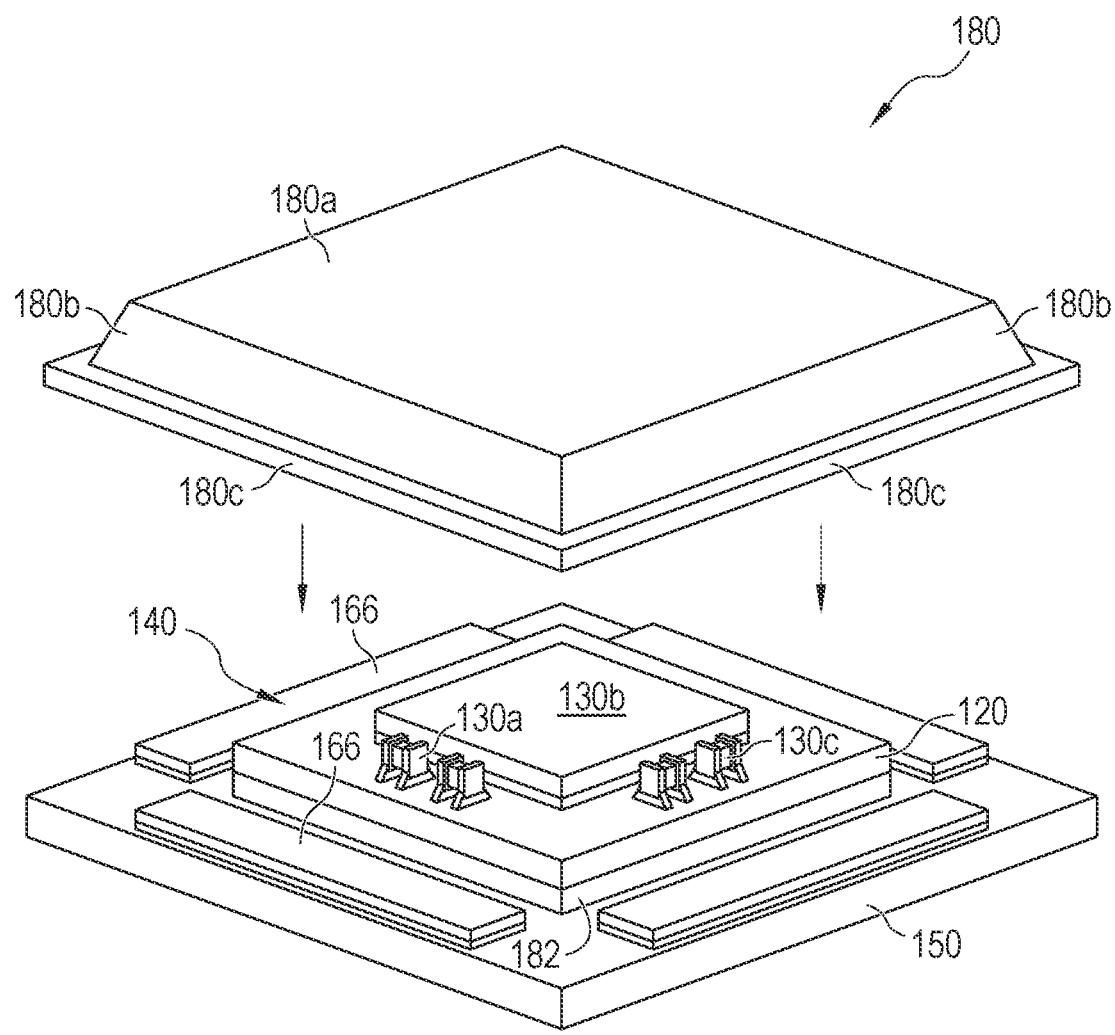

FIG. 4h is a perspective view of heat sink 180 positioned above semiconductor package 140, interconnect substrate 150, and e-bar substrates 166.

Figure 4I:
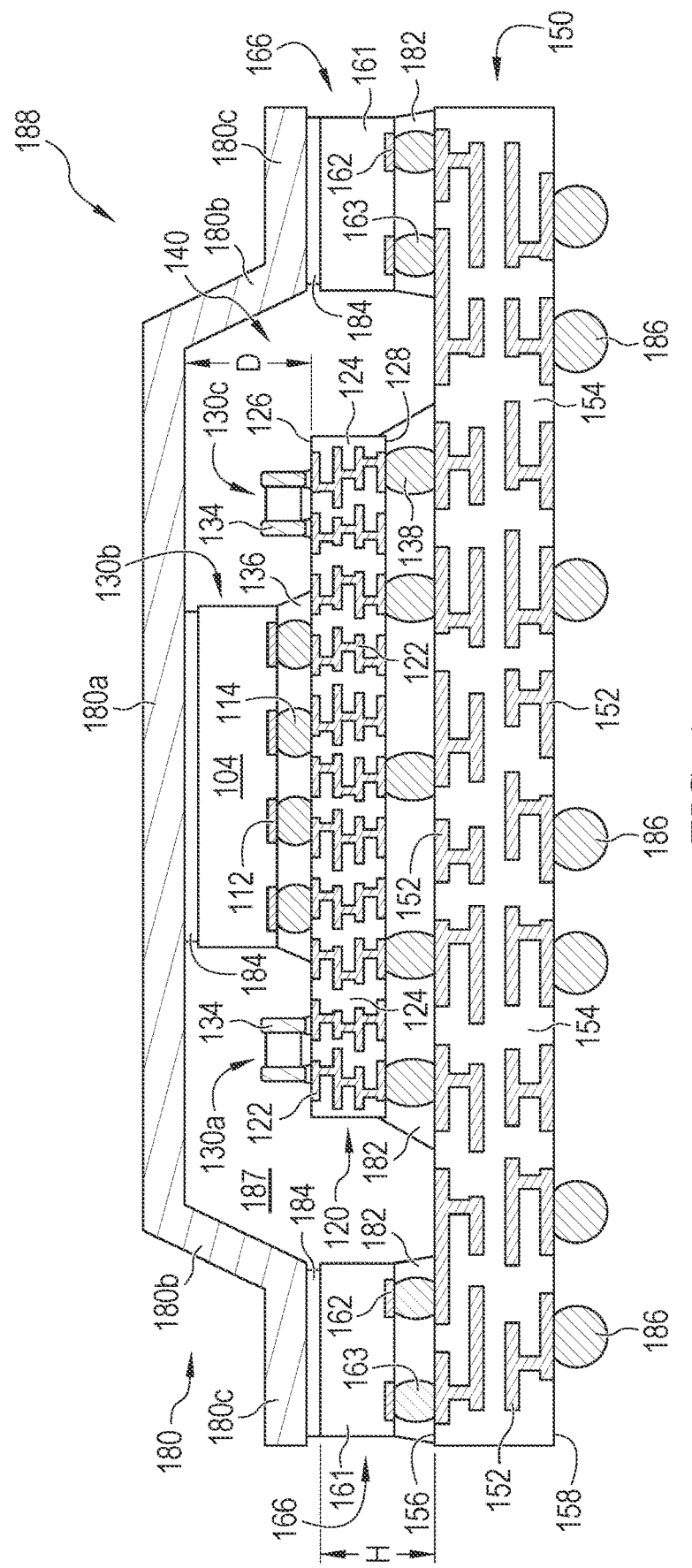
Figure 4J:
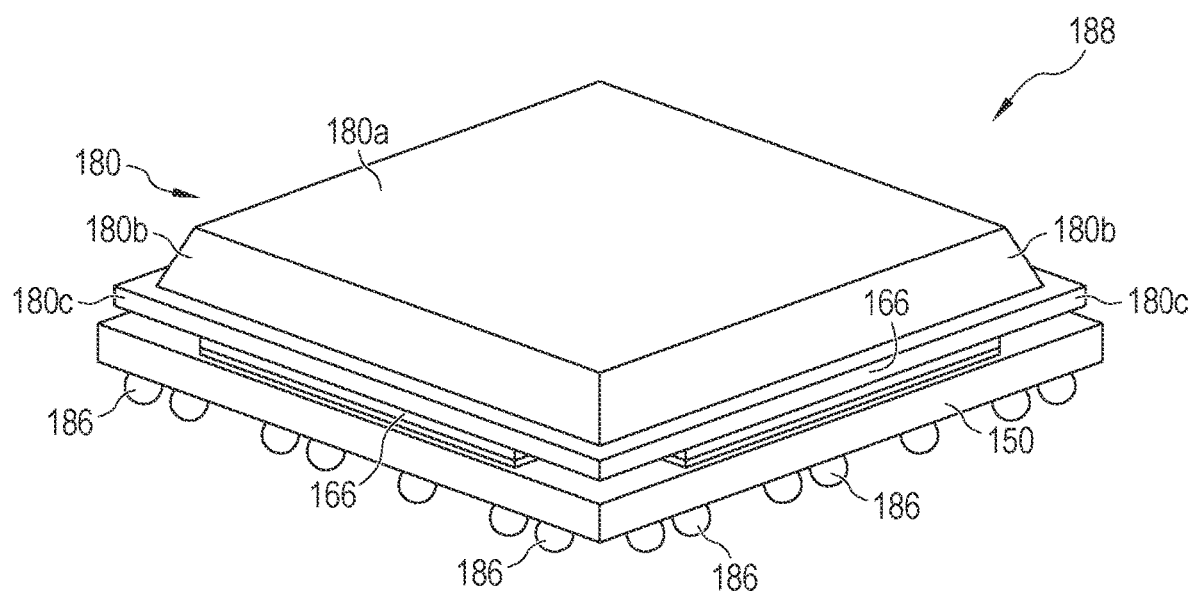
Figure 4K:
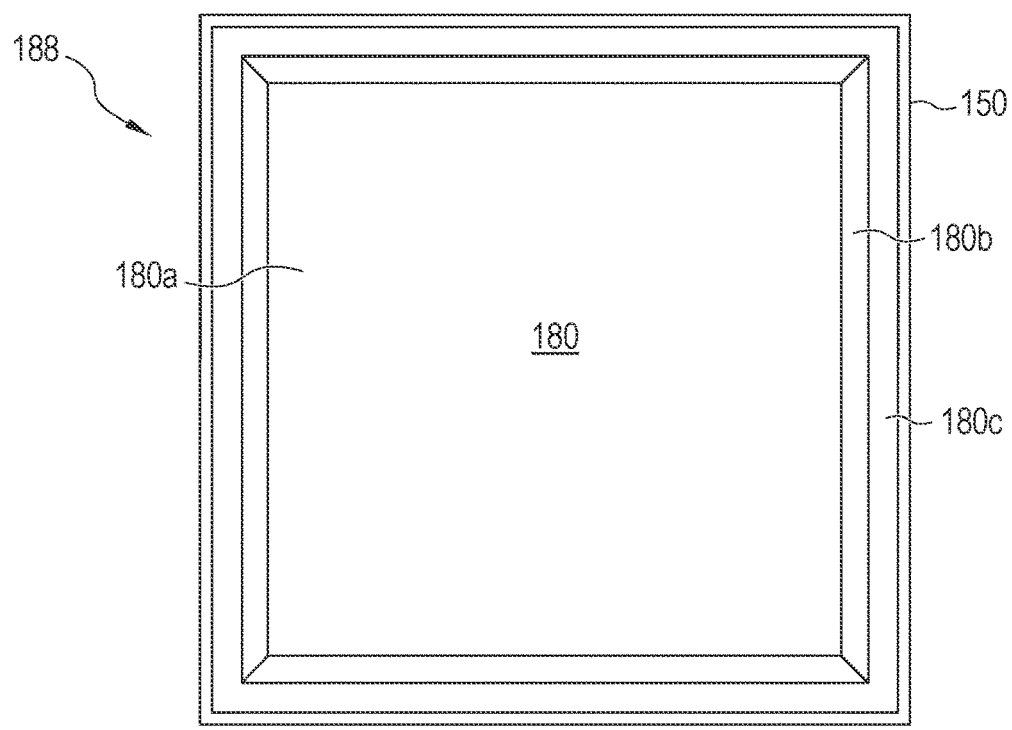

Heat sink 180 is brought into contact with adhesive layer 184. FIG. 4i shows heat sink 180 disposed on e-bar substrates 166 over semiconductor package 140. Heat sink 180 is held in place by nature of adhesive layer 184. FIG. 4j is a perspective view of heat sink 180 disposed on semiconductor package 140 and e-bar substrates 166. FIG. 4k is a top view of heat sink 180 disposed on semiconductor package 140 and e-bar substrates 166. Heat sink 180 dissipates heat generated by semiconductor package 140, as well as electrical components 130a, 130c, and transferred through adhesive layer 184 to the heat sink.

An electrically conductive bump material is deposited over conductive layer 152 on surface 158 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 152 using a suitable attachment or bonding process. In one embodiment, the bump material is reflowed by heating the material above its melting point to form balls or bumps 186. In one embodiment, bump 186 is formed over a UBM having a wetting layer, barrier layer, and adhesive layer. Bump 186 can also be compression bonded or thermocompression bonded to conductive layer 152. In one embodiment, bump 186 has a copper core bump for durability and maintaining its height. Bump 186 represents one type of interconnect structure that can be formed over conductive layer 152. The interconnect structure can also use bond wires, conductive paste, stud bump, micro bump, or other electrical interconnect.

In particular, heat sink 180 is physically supported by e-bar substrates 166. E-bar substrates 166 provide a vertical offset from surface 156 of interconnect substrates generally determined by the height H plus a minimal thickness of adhesive layer 184. The height H of e-bar substrate 166 may be coplanar with surface 126 of interconnect substrate 120, or greater than a height of surface 126 of interconnect substrate 120 above surface 156 of substrate 150. With e-bar substrates 166, heat sink 180 is elevated with respect to surface 156 to reduce the distance D between surface 170 and surface 172. The angled or vertical portion 180b and horizontal portion 180c do not need to extend down to interconnect substrate 150 due to the horizontal portion being elevated by e-bar substrate 166. Accordingly, the overall height of heat sink 180 is reduced with e-bar substrates 166. E-bar substrates 166 provide a vertical offset with respect to surface 156 that reduce the length of angled or vertical portion 180b and the overall height of heat sink 180. Horizontal portion 180c of heat sink 180 being supported by e-bar substrate 166 reduces the height of the heat sink while still providing clearance for semiconductor package 140. The area of cavity 187, between surface 170 and surface 172, is reduced by nature of e-bar substrate 166 elevating heat sink 180 from surface 156. By reducing the length of angled or vertical portion 180b, as well as area of cavity 187, heat sink 180 can be thinner, with greater and more robust structural integrity, resulting in fewer defects as opposed to prior art heat sinks, as discussed in the background.

The combination of semiconductor package 140, interconnect substrate 150, e-bar substrates 166, and heat sink 180 constitute BGA semiconductor package 188.

The configuration of e-bar substrate 166 can vary with the application. FIG. 5a shows an alternate e-bar substrate 200 with base layer 202, similar to base layer 161 in FIGS. 3a-3d. In one embodiment, base layer 202 is a CCL. Metal layer 204 is formed over the entire surface 206 of base layer 202. Metal layer or contact 208 is formed over surface 210 of base layer 202. Metal layers 204 and 208 can be one or more layers of Al, Cu, Sn, Ni, Au, Ag, or other suitable material. Bumps 212 are formed over metal layer 208.

FIG. 5b shows another e-bar substrate 220 with base layer 222, similar to base layer 161 in FIGS. 3a-3d. In one embodiment, base layer 222 is a CCL. Metal layer 224 is formed over the entire surface 226 of base layer 222. Metal layer 228 is formed over surface 230 of base layer 222. Metal pillars or posts 229 extend between metal layer 224 and metal layer 228. Metal layer or contacts 232 is formed over metal layer 228. Metal layers 224, 228, and 230 can be one or more layers of Al, Cu, Sn, Ni, Au, Ag, or other suitable material. Bumps 234 are formed over metal layer 232. An insulating material 236 is formed over metal layer 228 around metal layer 232 and bumps 234.

FIG. 5c shows a stacked e-bar substrate 240 with base layer 242, similar to base layer 161 in FIGS. 3a-3d. In one embodiment, base layer 242 is a CCL. Metal layer 244 is formed over the entire surface 246 of base layer 242. The stacked e-bar substrate 240 has a second base layer 248, similar to base layer 161 in FIGS. 3a-3d. In one embodiment, base layer 248 is a CCL. Metal layer 250 is formed over the entire surface 252 of base layer 248. Metal layer 256 is formed over the entire surface 258 of base layer 248. Metal pillars or posts 259 extend between metal layer 250 and metal layer 256. Metal layer 244 contacts metal layer 250. Metal layer 260 is formed over surface 262 of base layer 242. Metal pillars or posts 263 extend between metal layer 244 and metal layer 260. Metal layer or contact 264 is formed over metal layer 260. Metal layers 244, 250, 256, 260, and 264 can be one or more layers of Al, Cu, Sn, Ni, Au, Ag, or other suitable material. Bumps 266 are formed over metal layer 264. An insulating material 268 is formed over metal layer 260 around metal layer 264 and bumps 268. The combination of two base layers 242 and 248 with the above metal layers constitute two stack e-bar substrates.

FIG. 5d shows another e-bar substrate 270 with base layer 272, similar to base layer 161 in FIGS. 3a-3d. In one embodiment, base layer 272 is a CCL. Metal layer 274 is formed over the entire surface 276 of base layer 272. Metal layer 278 is formed over surface 280 of base layer 272. Metal layers 274, and 278 can be one or more layers of Al, Cu, Sn, Ni, Au, Ag, or other suitable material. Bump 280 is formed over most if not all of the surface area of metal layer 278.

FIG. 5e shows a stacked e-bar substrate 290 with base layer 292, similar to base layer 161 in FIGS. 3a-3d. In one embodiment, base layer 292 is a CCL. Metal layer 294 is formed over the entire surface 296 of base layer 292. The stacked e-bar substrate 290 has a second base layer 298, similar to base layer 161 in FIGS. 3a-3d. In one embodiment, base layer 298 is a CCL. Metal layer 300 is formed over the entire surface 302 of base layer 298. Metal layer 306 is formed over the entire surface 308 of base layer 298. Metal layer 294 contacts metal layer 306. Metal layer 310 is formed over surface 312 of base layer 292. Metal layers 294, 300, 306, and 310 can be one or more layers of Al, Cu, Sn, Ni, Au, Ag, or other suitable material. Bump 314 is formed over most if not all of the surface area of metal layer 310. The combination of two base layers 292 and 298 with the above metal layers constitute two stack e-bar substrates.

Figure 5F:
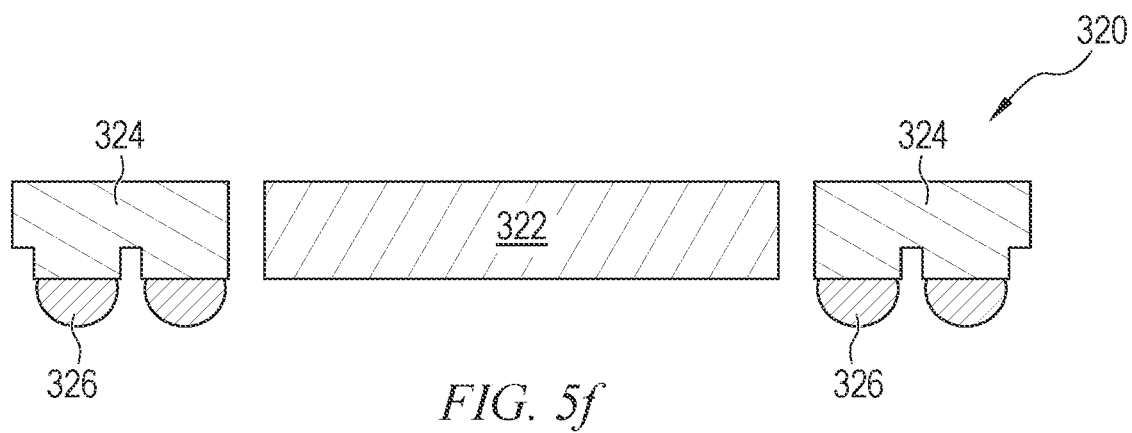

FIG. 5f shows another e-bar substrate 320 with leadframe flag 322 and contacts 324. In one embodiment, leadframe 322-324 is Cu. Bumps 326 are formed over contacts 324.

Figure 5G:
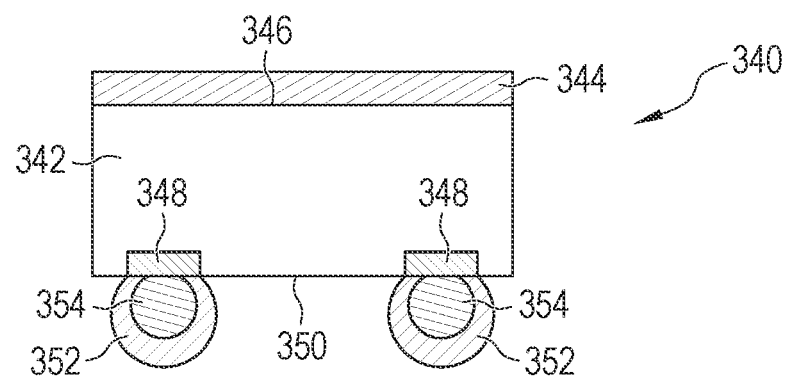

FIG. 5g shows another e-bar substrate 340 with base layer 342, similar to base layer 161 in FIGS. 3a-3d. In one embodiment, base layer 342 is a CCL. Metal layer 344 is formed over the entire surface 346 of base layer 342. Metal layer or contact 348 is formed within surface 350 of base layer 342. Metal layers 344 and 348 can be one or more layers of Al, Cu, Sn, Ni, Au, Ag, or other suitable material. Bumps 352 are formed over metal layer 348. In particular, bumps 352 include a Cu core 354.

E-bar substrates 200, 220, 240, 270, 290, 320, and 340 from FIG. 5a-5g can be used in addition to, or in place of, e-bar substrate 166 in FIG. 4i.

In particular, heat sink 180 is physically supported by e-bar substrates 166 and/or 200-340. E-bar substrates 166 and/or 200-340 provide a vertical offset from surface 156 of interconnect substrate generally determined by the height H plus a minimal thickness of adhesive layer 184. The height H of e-bar substrate 166 may be coplanar with surface 126 of interconnect substrate 120, or greater than a height of surface 126 of interconnect substrate 120 above surface 156 of substrate 150. With e-bar substrates 166 and/or 200-340, heat sink 180 is elevated with respect to surface 156 to reduce the distance D between surface 170 and surface 172. The angled or vertical portion 180b and horizontal portion 180c do not need to extend down to interconnect substrate 150 due to the horizontal portion being elevated by e-bar substrate 166. Accordingly, the overall height of heat sink 180 is reduced with e-bar substrates 166 and/or 200-340. E-bar substrates 166 and/or 200-340 provide a vertical offset with respect to surface 156 that reduce the length of angled or vertical portion 180b and the overall height of heat sink 180. Horizontal portion 180c of heat sink 180 being supported by e-bar substrates 166 and/or 200-340 reduces the height of the heat sink while still providing clearance for semiconductor package 140. The area of cavity 187, between surface 170 and surface 172, is reduced by nature of e-bar substrates 166 and/or 200-340 elevating heat sink 180 from surface 156. By reducing the length of angled or vertical portion 180b, as well as area of cavity 187, heat sink 180 can be thinner, with greater and more robust structural integrity, resulting in fewer defects as opposed to prior art heat sinks, as discussed in the background.

Figure 6:
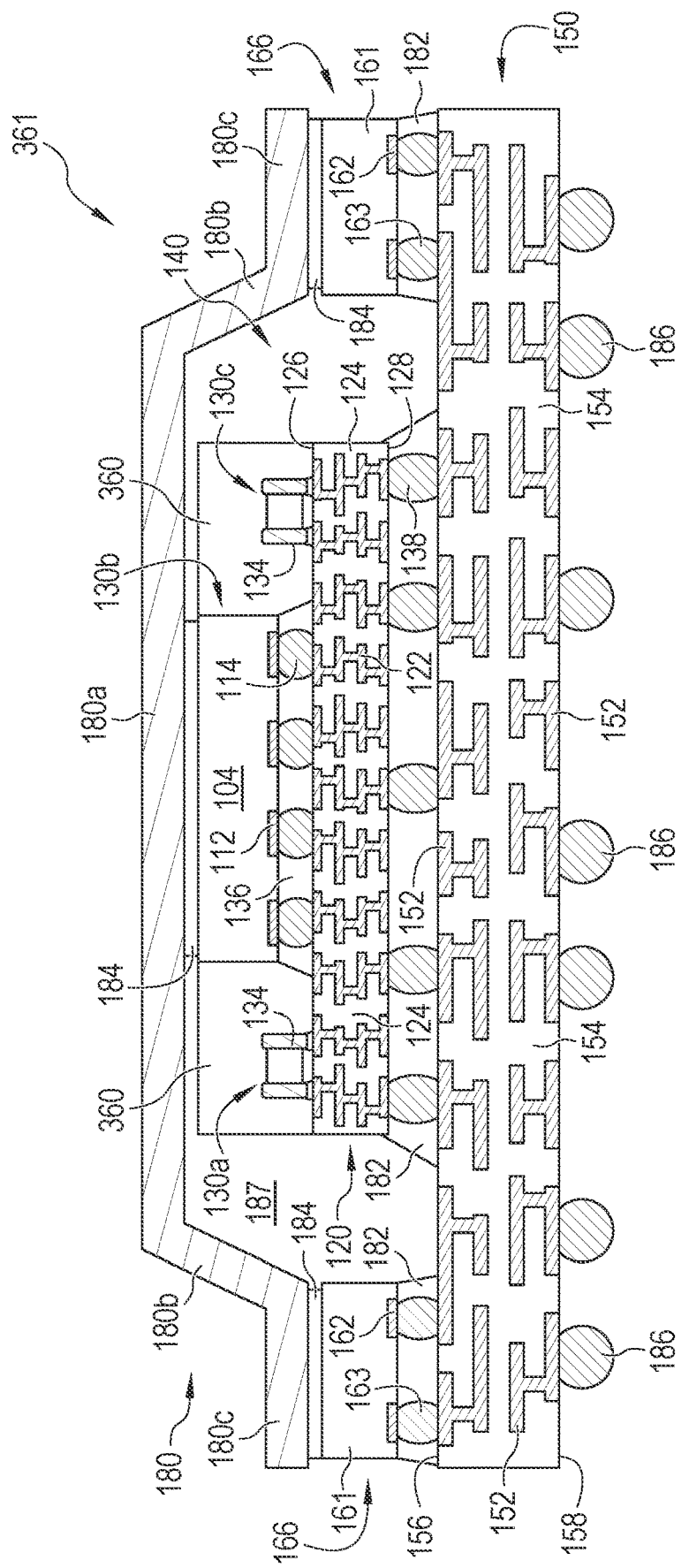
FIG. 6 illustrates the BGA semiconductor package with encapsulant around the electrical components.

In another embodiment, continuing from FIG. 4i, an encapsulant or molding compound 360 is deposited over and around electrical components 130a-130c and interconnect substrate 120 using a paste printing, compressive molding, transfer molding, liquid encapsulant molding, vacuum lamination, spin coating, or other suitable applicator, as shown in FIG. 6 as BGA semiconductor package 361. Encapsulant 360 can be polymer composite material, such as epoxy resin with filler, epoxy acrylate with filler, or polymer with proper filler. Encapsulant 360 is non-conductive, provides structural support, and environmentally protects the semiconductor device from external elements and contaminants.

Figure 7:
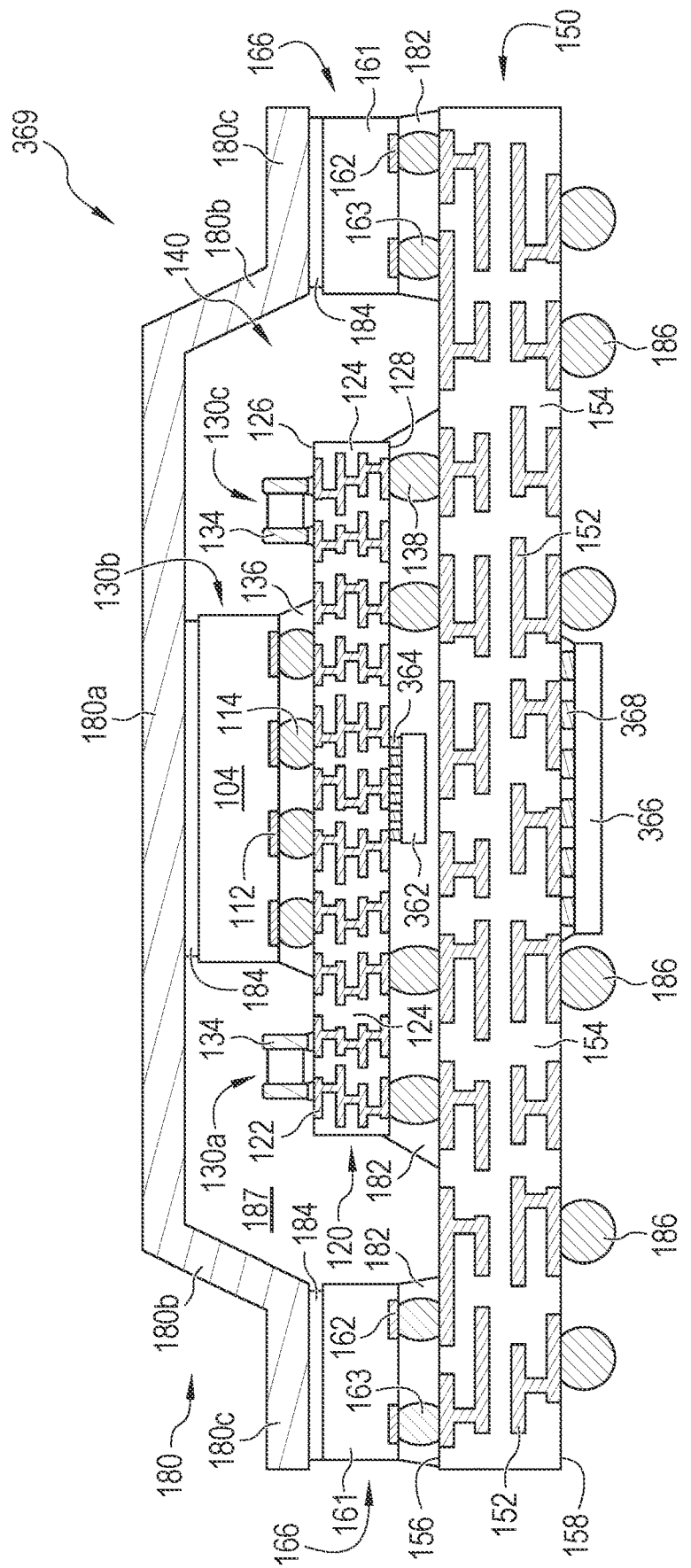
FIG. 7 illustrates the BGA semiconductor package with additional electrical components disposed under the HDI substrate.

In another embodiment, continuing from FIG. 4*i*, semiconductor die 362, similar to semiconductor die 104 from FIGS. 1*a*-1*c*, although with a different form and function, is disposed on surface 128 of interconnect substrate 120 and electrically and mechanically connected to conductive layer 122 with bumps 364, as shown in FIG. 7. In addition, semiconductor die 366, similar to semiconductor die 104 from FIGS. 1*a*-1*c*, although with a different form and function, is disposed on surface 158 of interconnect substrate 150 and electrically and mechanically connected to conductive layer 152 with bumps 368, and shown as BGA semiconductor package 369.

The advantages of e-bar substrates 166 and/or 200-340, as discussed above, apply to BGA semiconductor packages 361 and 369.

Figure 8A:
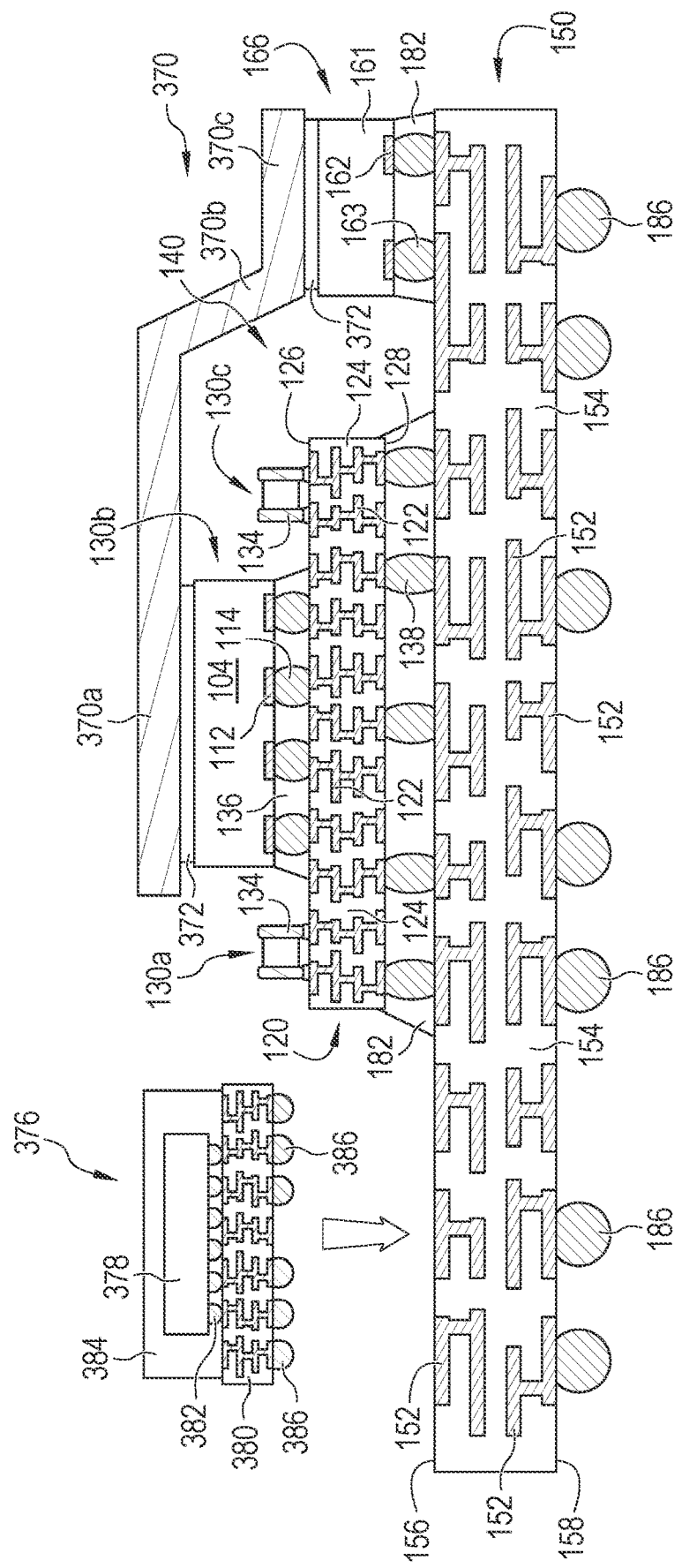
FIGS. 8a-8b illustrate another embodiment of the BGA semiconductor package and half heat sink.

In another embodiment, continuing from FIG. 4*d*, heat sink 370 is disposed on semiconductor package 140 and e-bar substates 166 and/or 200-340 with adhesive layer 372, as shown in FIG. 8*a*. Adhesive layer 372 can be TIM. Heat sink 370 has a horizontal portion 370*a*, angled or vertical leg extension 370*b*, and horizontal portion 370*c* around a portion of semiconductor package 140, less than an entirety of the semiconductor package, e.g., half heat sink. Semiconductor package 376 includes semiconductor die 378, similar to semiconductor die 104 from FIGS. 1*a*-1*c*, although with a different form and function. Semiconductor die 378 is disposed on interconnect substrate 380 with bumps 382. Encapsulant 384 is deposited over and around semiconductor die 378 and substrate 380. Bumps 386 are formed on a surface of interconnect substrate 380 opposite semiconductor die 378.

Figure 8B:
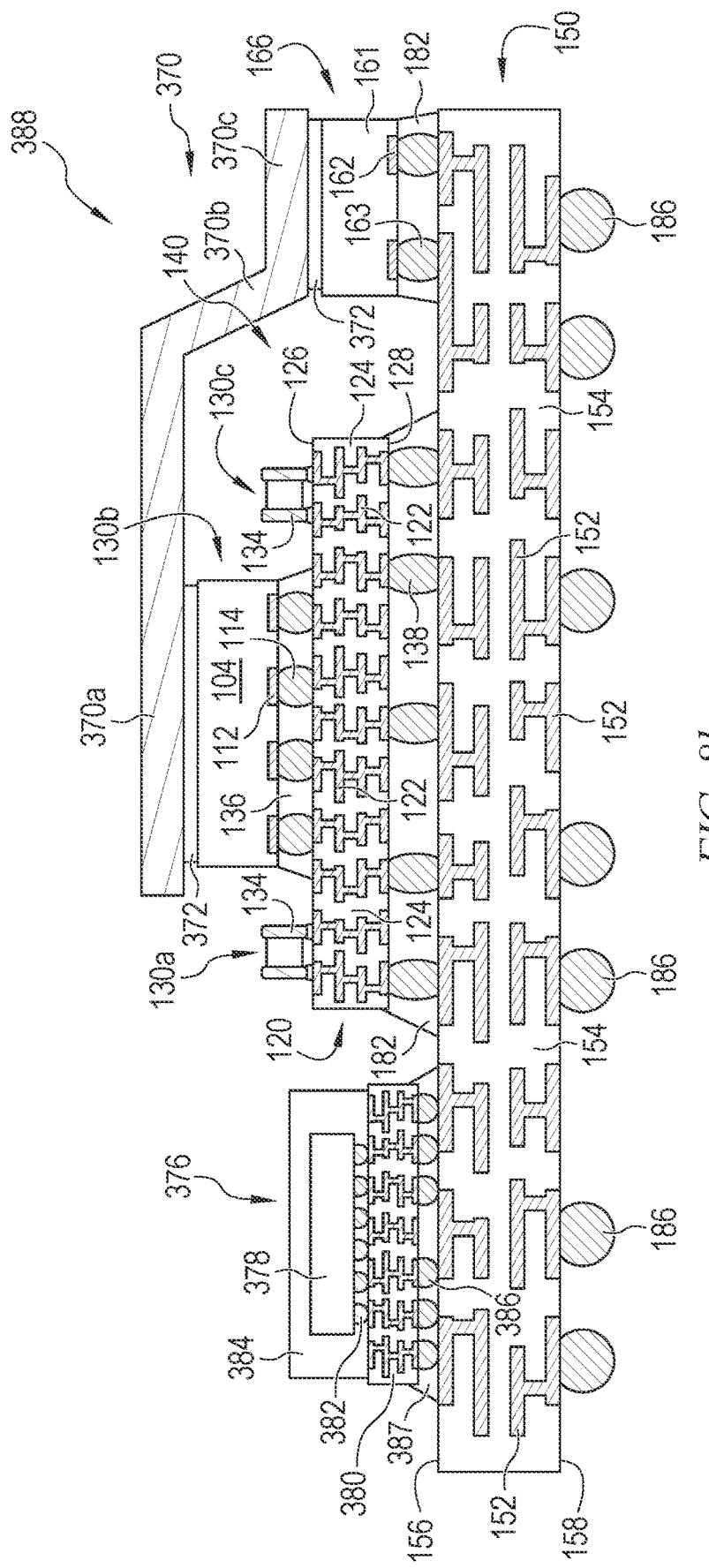

Semiconductor package 376 is brought into contact with surface 156 of substrate 150 and bumps 386 make mechanical and electrical connection to conductive layer 152. In FIG. 8*b*, semiconductor package 376 is disposed on surface 156 of interconnect substrate 150 with bumps 386 making electrical and mechanical connection to conductive layer 152. An underfill material 387, such as epoxy resin, is deposited under semiconductor package 376.

In particular, half heat sink 370 is physically supported by e-bar substrates 166 and/or 200-340. E-bar substrates 166 and/or 200-340 provide a vertical offset from surface 156 of interconnect substrate generally determined by the height H plus a minimal thickness of adhesive layer 372. The height H of e-bar substrate 166 may be coplanar with surface 126 of interconnect substrate 120, or greater than a height of surface 126 of interconnect substrate 120 above surface 156 of substrate 150. With e-bar substrates 166 and/or 200-340, heat sink 370 is elevated with respect to surface 156 to reduce the distance D between surface 170 and surface 172. The angled or vertical portion 370*b* and horizontal portion 370*c* do not need to extend down to interconnect substrate 150 due to the horizontal portion being elevated by e-bar substrate 166. Accordingly, the overall height of heat sink 180 is reduced with e-bar substrates 166 and/or 200-340. E-bar substrates 166 and/or 200-340 provide a vertical offset with respect to surface 156 that reduce the length of angled or vertical portion 180*b* and the overall height of heat sink 180. Horizontal portion 370*c* of heat sink 370 being supported by e-bar substrates 166 and/or 200-340 reduces the height of the heat sink while still providing clearance for semiconductor package 140. The area of cavity 187, between surface 170 and surface 172, is reduced by nature of e-bar substrates 166 and/or 200-340 elevating heat sink 370 from surface 156. By reducing the length of angled or vertical portion 370*b*, as well as area of cavity 187, heat sink 180 can be thinner, with greater and more robust structural integrity, resulting in fewer defects as opposed to prior art heat sinks, as discussed in the background.

Electrical components 130*a*-130*c* may contain IPDs that are susceptible to or generate EMI, RFI, harmonic distortion, and inter-device interference. For example, the IPDs contained within electrical components 130*a*-130*c* provide the electrical characteristics needed for high-frequency applications, such as resonators, high-pass filters, low-pass filters, band-pass filters, symmetric Hi-Q resonant transformers, and tuning capacitors. In another embodiment, electrical components 130*a*-130*c* contain digital circuits switching at a high frequency, which could interfere with the operation of other IPDs.

Figure 9:
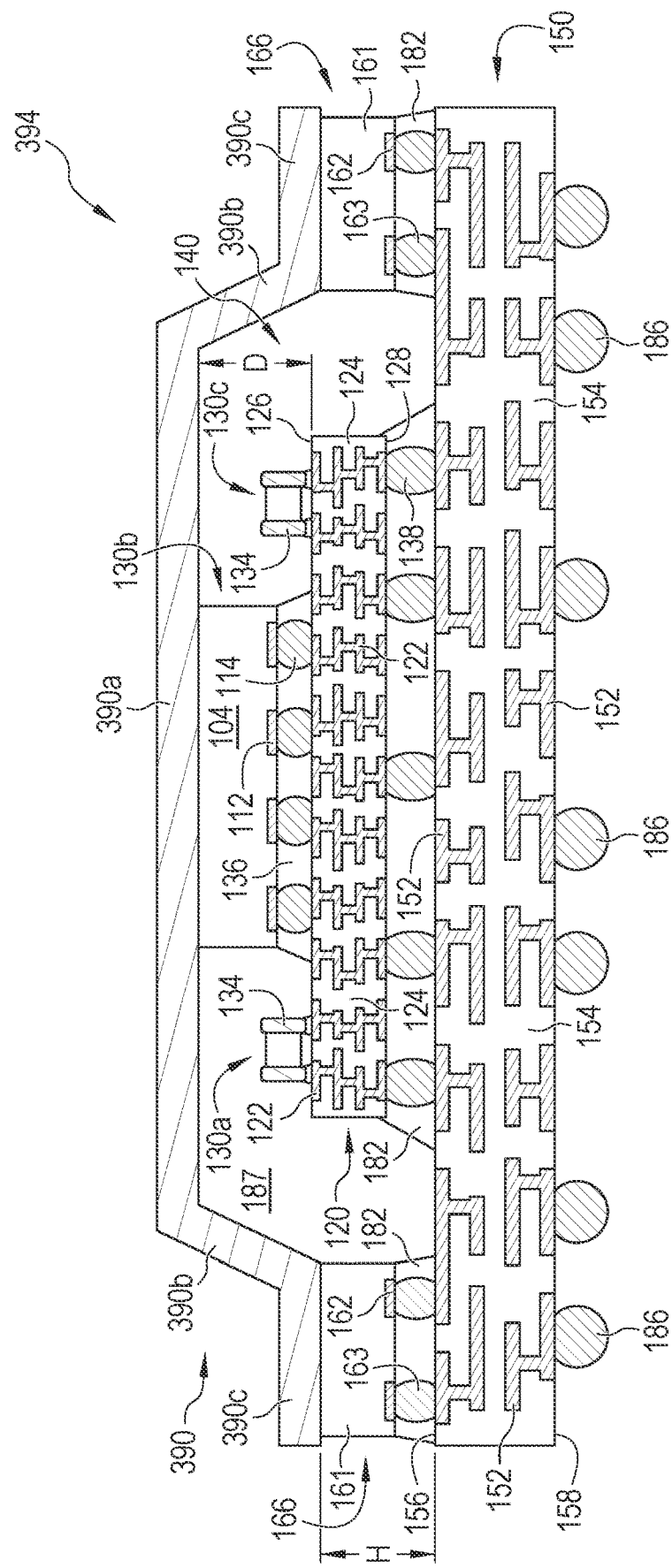
FIG. 9 illustrates the BGA semiconductor package with electromagnetic shielding material elevated by e-bar substrates.

To address EMI, RFI, harmonic distortion, and inter-device interference, electromagnetic shielding material 390 is formed over semiconductor package 140, similar to FIGS. 4*a*-4*i*. FIG. 9 shows electromagnetic shielding material 390 formed over semiconductor package 140 and offset by e-bar substrates 220. Electromagnetic shielding material 390 can be one or more layers of Al, Cu, Sn, Ni, Au, Ag, or other suitable conductive material. Alternatively, electromagnetic shielding material 390 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Shielding material 390 is grounded through metal layers 224, 228, 229, 232 and bumps 234 in e-bar substrate 220.

The combination of semiconductor package 140, interconnect substrate 150, e-bar substrates 220, and shielding material 390 constitute semiconductor package 394.

In particular, electromagnetic shielding material 390 is physically supported by e-bar substrates 220. E-bar substrates 220 provide a vertical offset from surface 156 of interconnect substrate generally determined by the height H. The height H of e-bar substrate 220 may be coplanar with surface 126 of interconnect substrate 120, or greater than a height of surface 126 of interconnect substrate 120. With e-bar substrates 166, the distance D between surface 170 and surface 172 can be reduced. The angled or vertical portion 390*b* and horizontal portion 390*c* do not need to extend down to interconnect substrate 150. Accordingly, the overall height of shielding material 390 is reduced with e-bar substrates 220. E-bar substrates 220 provide an offset from surface 156 that reduce the length of angled or vertical portion 390*b* and the overall height of shielding material 390.

Figure 10:
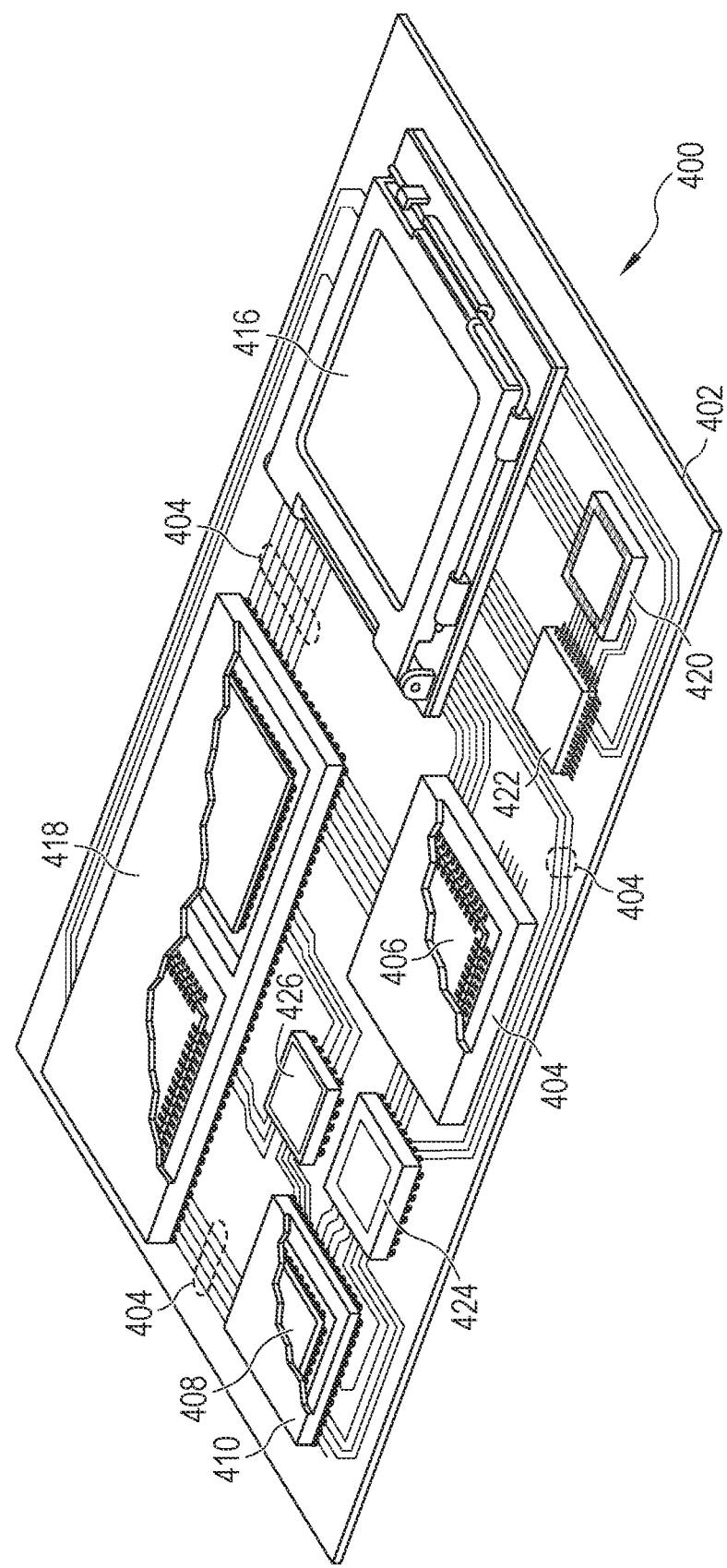
FIG. 10 illustrates a printed circuit board (PCB) with different types of packages disposed on a surface of the PCB.

FIG. 10 illustrates electronic device 400 having a chip carrier substrate or PCB 402 with a plurality of semiconductor packages disposed on a surface of PCB 402, including BGA semiconductor packages 188, 361, 369, and 394. Electronic device 400 can have one type of semiconductor package, or multiple types of semiconductor packages, depending on the application.

Electronic device 400 can be a stand-alone system that uses the semiconductor packages to perform one or more electrical functions. Alternatively, electronic device 400 can be a subcomponent of a larger system. For example, electronic device 400 can be part of a tablet, cellular phone, digital camera, communication system, or other electronic device. Alternatively, electronic device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 10, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    disposing a semiconductor package over a substrate;
    disposing an embedded bar (e-bar) substrate on the substrate around the semiconductor package with a height of the e-bar substrate above the substrate being less than a height of the semiconductor package above the substrate; and
    forming a heat sink over the semiconductor package and supported by the e-bar substrate to elevate the heat sink from the substrate.

2. The method of claim 1, wherein the e-bar substrate includes:
    providing a base layer; and
    forming a first metal layer over a first surface of the base layer.

3. The method of claim 2, wherein the e-bar substrate further includes forming a bump over the first metal layer.

4. The method of claim 2, wherein the e-bar substrate further includes forming a second metal layer over a second surface of the base layer opposite the first surface of the base layer.

5. The method of claim 1, further including stacking two or more e-bar substrates.

6. The method of claim 1, further including forming a thermal interface material between the semiconductor package and heat sink.

7. The method of claim 1, wherein the heat sink includes a first horizontal portion disposed over the semiconductor package, an angled portion extending from the first horizontal portion, and a second horizontal portion extending from the angled portion to contact the e-bar substrate.

8. A method of making a semiconductor device, comprising:
    disposing a semiconductor package over a substrate;
    disposing an embedded bar (e-bar) substrate on the substrate around the semiconductor package with the semiconductor package extending above the e-bar substrate; and
    forming a structure over the semiconductor package and supported by the e-bar substrate to elevate the structure from the substrate.

9. The method of claim 8, wherein the structure includes a heat sink.

10. The method of claim 8, wherein the structure includes a shielding material.

11. The method of claim 8, wherein the e-bar substrate includes:
    providing a base layer; and
    forming a first metal layer over a first surface of the base layer.

12. The method of claim 11, wherein the e-bar substrate further includes forming a bump over the first metal layer.

13. The method of claim 11, wherein the e-bar substrate further includes forming a second metal layer over a second surface of the base layer opposite the first surface of the base layer.

14. The method of claim 8, further including stacking two or more e-bar substrates.

15. The method of claim 8, wherein the structure includes a first horizontal portion disposed over the semiconductor package, an angled portion extending from the first horizontal portion, and a second horizontal portion extending from the angled portion to contact the e-bar substrate.

16. A semiconductor device, comprising:
    a substrate;
    a semiconductor package disposed over the substrate;
    an embedded bar (e-bar) substrate disposed on the substrate around the semiconductor package with a height of the e-bar substrate above the substrate being less than a height of the semiconductor package above the substrate; and a heat sink formed over the semiconductor package and supported by the e-bar substrate to elevate the heat sink from the substrate.

17. The semiconductor device of claim 16, wherein the e-bar substrate includes:
a base layer; and
a first metal layer formed over a first surface of the base layer.

18. The semiconductor device of claim 17, wherein the e-bar substrate further includes a bump formed over the first metal layer.

19. The semiconductor device of claim 17, wherein the e-bar substrate further includes a second metal layer formed over a second surface of the base layer opposite the first surface of the base layer.

20. The semiconductor device of claim 16, further including two or more e-bar substrates stacked.

21. The semiconductor device of claim 16, further including a thermal interface material deposited between the semiconductor package and heat sink.

22. The semiconductor device of claim 16, wherein the heat sink includes a first horizontal portion disposed over the semiconductor package, an angled portion extending from the first horizontal portion, and a second horizontal portion extending from the angled portion to contact the e-bar substrate.

23. A semiconductor device, comprising:
a substrate;
a semiconductor package disposed over the substrate;
an embedded bar (e-bar) substrate disposed on the substrate around the semiconductor package with the semiconductor package extending above the e-bar substrate; and
a structure formed over the semiconductor package and supported by the e-bar substrate to elevate the structure from the substrate.

24. The semiconductor device of claim 23, wherein the structure includes a heat sink.

25. The semiconductor device of claim 23, wherein the structure includes a shielding material.

26. The semiconductor device of claim 23, wherein the e-bar substrate includes:
a base layer; and
a first metal layer formed over a first surface of the base layer.

27. The semiconductor device of claim 26, wherein the e-bar substrate further includes a bump formed over the first metal layer.

28. The semiconductor device of claim 23, further including stacking two or more e-bar substrates.

29. The semiconductor device of claim 23, wherein the structure includes a first horizontal portion disposed over the semiconductor package, an angled portion extending from the first horizontal portion, and a second horizontal portion extending from the angled portion to contact the e-bar substrate.

* * * * *